THYRISTOR SWITCH CIRCUIT FOR PRODUCING PULSES OF VARIABLE WIDTHS AND HAVING DIODE MEANS FOR SHORTENING THE FALL TIMES OF THE PULSES

Filed April 10, 1967 2 Sheets-Sheet 1

INVENTORS W. B. HARRIS
R. P. MASSEY
BY
[signature] Stoddard
ATTORNEY

United States Patent Office 3,479,533
Patented Nov. 18, 1969

3,479,533

THYRISTOR SWITCH CIRCUIT FOR PRODUCING PULSES OF VARIABLE WIDTHS AND HAVING DIODE MEANS FOR SHORTENING THE FALL TIMES OF THE PULSES

William B. Harris, Bernardsville, and Richard P. Massey, Westfield, N.J., assignors to Bell Telephone Laboratories, Incorporated, Murray Hill and Berkeley Heights, N.J., a corporation of New York Filed Apr. 10, 1967, Ser. No. 629,713
Int. Cl. H03k *5/12*
U.S. Cl. 307—265 23 Claims

ABSTRACT OF THE DISCLOSURE

The fall time of a rectangular pulse produced by a switch circuit employing a single thyristor can be materially shortened by connecting across the load a circuit comprising a resistor in series with a step recovery diode. The conventional reverse current turn-off circuit has its connections modified so that one of its leads extends to the junction between the serially connected diode and resistor. This switch circuit can be adapted for producing pulses having variable widths by connecting a second thyristor between the load and the first thyristor.

BACKGROUND OF THE INVENTION

This invention relates to improved semiconductor switch circuits capable of operating at high speeds in high power circuits for producing rectangular pulses having variable widths and fast fall times.

Semiconductor switches of the prior art have used a variety of semiconductor devices. The semiconductor devices most commonly used in switch circuits are four-layer PNPN devices known as silicon controlled rectifiers or thyristors. As is well known, a PNPN device is usually provided with three terminals and has properties somewhat analogous to a gas-filled thyratron and, like the thyratron, once it is switched on, it remains conductive until a turn-off mechanism is operated. Although the operating speed of the thyristor is inherently much greater than that of the thyratron, some utilization circuits require faster operating speeds than those for which a thyristor is inherently capable.

The need for faster opearting speeds has been met by a prior art thyristor switch circuit which is disclosed and claimed in a copending patent application filed by Messrs. W. B. Harris, R. P. Massey, and F. J. Zgebura. This prior application, bearing Ser. No. 537,544, was filed on Mar. 25, 1966 now Patent No. 3,404,293, and is assigned to the same assignee as the present application. The circuit of this copending application is described in deail hereinafter with reference to FIG. 1 of the drawing.

Although this prior art circuit has made it possible to reduce the turn-off time of the thyristor switch to one-half or less of its inherent turn-off time, it is not fully satisfactory for all purposes. The reason for this is that a pulse produced by this switch circuit has a relatively slow fall time due to the capacity effect inherent in the load, or utilization circuit, and also to residual energy stored in the turn-off circuit.

Accordingly, it is an object of this invention to provide a pulse -producing thyristor switch circuit with means for substantially shortening the fall time of the pulses.

SUMMARY OF THE INVENTION

The invention comprises a switch circuit employing a single thyristor and having a conventional reverse current turn-off circuit and an impedance between the gate and cathode of the thyristor to reduce false triggering from the rate effect. Both the rate effect and the turn-off capabilities are improved by connecting a diode between the gate and cathode of the thyristor, and another diode between the gate and anode of the thyristor. These diodes are so constructed that the revrese recovery time of the middle junction in the thyristor is less than that of the first diode and greater than that of the second diode.

The fall time of a pulse produced by this thyristor switch circuit is substantially shortened by connecting across the load a circuit comprising a resistor in series with a step recovery diode. The connections from the reverse current turn-off circuit are modified so that one of its leads extends to the junction between the serially connected resistor and diode. When it is desired to employ this switch circuit for producing pulses having variable widths, a second thyristor is connected between the load and the first thyristor.

BRIEF DESCRIPTION OF THE DRAWING

The features of this invention are fully discussed hereinafter in realtion to a detailed description of the drawing in which.

DETAILED DESCRIPTION

Figure 1:
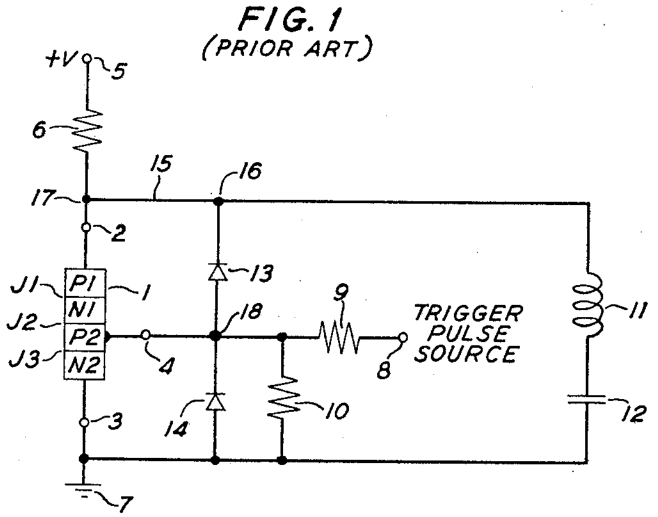
FIG. 1 (PRIOR ART)
FIG. 1 discloses the single thyristor switch circuit of the above-mentioned copending application.

The switch circuit of the above-mentioned copending patent application is represented in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A supply source of direct voltage has its positive side connected to a terminal 5 and is coupled through a load resistor 6 to the anode terminal 2. The cathode terminal 3 is connected to a source of ground potential 7 which is understood to be connected to the negative side of the source of direct voltage.

The switch circuit further includes a source 8 of trigger pulse current which is coupled through a resistor 9 to the gate terminal 4 and through a resistor 10 to the cathode terminal 3. As is well known in the art, a positive trigger pulse from source 8 will cause current to flow through the divider resistors 9 and 10 thereby producing a potential difference between the gate terminal 4 and the cathode terminal 3. This functions to trigger the thyristor 1 by substantially reducing the impedance between the anode terminal 2 and the cathode terminal 3. The triggering of the thyristor 1 causes current to flow from the source 5 of positive direct voltage, through the load resistor 6, through the anode-cathode path in the thyristor 1 to the ground 7, and then back to the negative side of the direct voltage supply.

At this point attention should be directed to a resonant turn-off circuit that comprises an inductor 11 and a capacitor 12 which are connected in series across the anode terminal 2 and the cathode terminal 3. Prior to the triggering of the thyristor 1, the capacitor 12 is charged to the same potential as that of the direct voltage source at terminal 5. When the thyristor is triggered, it becomes conductive and initiates the generation of a pulse across the load resistor 6. Also, at this time, a ringing current starts through inductor 11, thyristor 1, and capacitor 12. The first half cycle of this ringing current flows from the capacitor 12 through the inductor 11 and then in the forward direction through the thyristor 1.

At the beginning of the second half cycle, the ringing current reverses in phase and flows through the thyristor 1 in the reverse direction. This reverse ringing current quickly exceeds the normal load current thereby providing a net reverse current which flows from the cathode terminal 3, through all three of the junctions J1, J2, and J3, and then to the anode terminal 2.

In order to reduce the time required to restore the forward-blocking capability of the thyristor 1 and also to improve its dynamic breakdown capability, two diodes 13 and 14 are connected in series across the anode terminal 2 and the cathode terminal 3. It can be seen in FIG. 1 that this connection uses a lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the source 8 of trigger pulse current.

As is described in the above-mentioned copending application, the lower diode 14 has a reverse recovery time which is longer than the reverse recovery time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that at the beginning of the second half cycle of the ringing current, the ringing current will be a reverse current for the two outer junctions J1 and J3 but will be a forward current for the middle junction J2. Therefore, the lower diode 14 will be momentarily reverse biased by the charge stored in the lower junction J3 while the upper diode 13 will be biased below its threshold voltage by the opposed charges in junctions J1 and J2. This condition of the diodes 13 and 14 permits the reverse ringing current to flow through the thyristor 1 at the start of the second half cycle.

However, the flow of reverse ringing current quickly functions to reduce the charge density in junction J3 to zero thereby causing it to recover and open. This does not terminate the pulse because the pulse current across the load resistor 6 is maintained by the flow of current through the diode 14. During the transition in junction J3, the current flow through the lower diode 14 will increase and will reach a point at which the diode 14 will be carrying all of the reverse current.

Since the reverse ringing current is also a reverse current for the upper junction J1, the junction J1 will partially recover during the time that the lower junction J3 is carrying reverse current. When this lower junction J3 fully recovers, the reverse current will flow through the lower diode 14, through the gate terminal 4 and into the middle junction J2, and then out through the upper junction J1. This forces the upper junction J1 to complete its recovery and reduces its charge density to zero. In other words, the upper junction J1 is forced to recover due to a forward current flowing through the middle junction J2 and increasing the hole storage effect in junction J2.

During this change in junction J1, the current flowing through junctions J1 and J2 will be reduced toward zero while the current flowing through the upper diode 13 will be correspondingly increased to the limit of the reverse ringing current. This flow of current through the upper diode 13 will cause an additional charge to be stored in the lower diode 14. It should be noted that, since the middle junction J2 had been forward biased, the existing charge density in this junction J2 is not zero and it begins to recover by recombination. The thyristor 1 is now open at both junctions J1 and J3 and further reverse current is unnecessary except to store more charge in the lower diode 14.

During the latter portion of the second half cycle of ringing current, a second forward current will be applied to the thyristor 1 due to the fact that the reverse recovery time of the upper diode 13 is less than the reverse recovery time of the middle junction J2. This current will flow in the forward direction through the upper junction J1 and in the reverse direction through the middle junction J2 and the lower diode 14. This forces junction J2 to recover while diode 14 completes its recovery by recombination.

By thus designing diode 14 to recover more slowly than the middle junction J2, gate triggering of the thyristor 1 is prevented as is explained in the above-mentioned copending patent application. In addition, this provides a low impedance between the cathode terminal 3 and the gate terminal 4 for a short interval after the thyristor 1 recovers and thus improves the rate effect capability of this switch circuit.

As was stated above, the switch circuit of FIG. 1 has the advantage of possessing a fast operating speed for producing pulses. However, it is not fully satisfactory for all purposes because a pulse produced by this switch circuit has a relatively slow fall time due to the capacity effect inherent in the load and also to residual energy stored in the turn-off circuit.

Therefore, it is an object of the present invention to substantially shorten the fall time of a pulse produced by a thyristor switch circuit. This is accomplished in accordance with this invention by modifying the prior art switch circuit of FIG. 1 in the manner shown in FIG. 2 Since the thyristor switch circuit of FIG. 2 is a modification of the circuit of FIG. 1, those elements of FIG. 2 that are the same as those in FIG. 1 have been identified by giving them the same reference designations.

Figure 2:
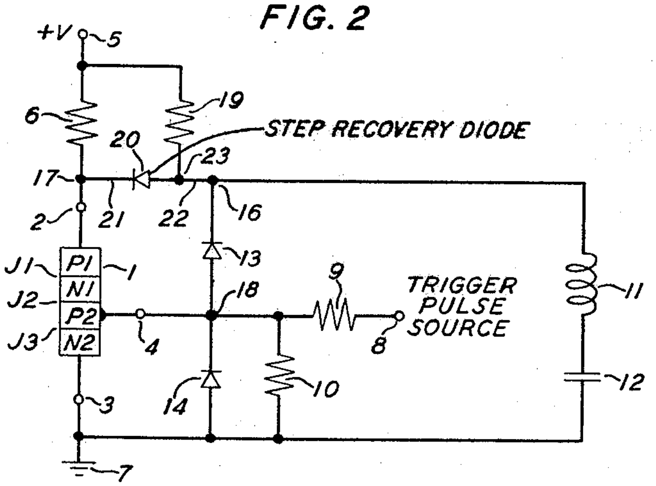
FIG. 2 represents the manner in which the circuit of FIG. 1 is modified in accordance with the present invention.

When the circuit of FIG. 2 is compared with the circuit of FIG. 1, it can be seen that the circuit of FIG. 1 has been modified by providing the load resistor 6 with a parallelly connected circuit comprising a serially connected resistor 19 and a diode 20. The resistor 19 is so selected as to have a resistance which is at least as large as the resistance of the load resistor 6. The diode 20 is of the type known to those skilled in the art as a step recovery diode and it is used in this circuit because the fall time of the reverse step of this diode 20 fixes the fall time of a pulse produced by the thyristor 1.

It can also be seen that the lead 15, which was shown in FIG. 1 to extend between the points 16 and 17, has been omitted in FIG. 2. The point 17, which is located between the load resistor 6 and the anode terminal 2 of the thyristor 1, is now connected in FIG. 2 by a lead 21 to the cathode of the diode 20.

Another distinction is that, in FIG. 2, the point 16, which is between the inductor 11 and the upper diode 13, is connected by a lead 22 to a point 23 between the resistor 19 and the anode of the diode 20. In other words, one side of the reverse current turn-off circuit is now coupled to the thyristor 1 by means of the diode 20.

This step recovery diode 20 is also known to those skilled in the art as a charge-storage diode. It is described by Messrs. J. L. Moll, S. Krakauer, and R. Shen in an article entitled "P-N Junction Charge-Storage Diodes" and published on pp. 43–53, inclusive, in vol. 50, No. 1, of the Proceedings of the IRE for January 1962. As is described in this article, this type of diode is designed to have finite carrier lifetime so as to conduct for a period of time in the reverse direction.

The junction of the diode is built with retarding fields for minority carriers in order to constrain storage to the vicinity of the junction. When the stored minority carriers are depleted, a very abrupt step in current occurs. In other words, when the diode recovers at the end of its storage time, it snaps off quickly thereby producing a sudden change in the current.

This steep reverse step is utilized in accordance with the present invention to fix the fall time of a pulse produced by the thyristor 1. In other words, the abrupt drop in the current produced by the diode 20 at the end of its storage, or reverse recovery, time is substantially duplicated by the fast fall time of the pulse produced by the thyristor 1. In addition, it should be noted that, in this circuit, the thyristor 1 functions in the manner of an amplifier to provide an output pulse having much more power than could be provided by the diode 20.

The thyristor switch circuit of FIG. 2 is normally open, as was the case with the circuit of FIG. 1, due to the relatively high impedance that now exists between the anode terminal 2 and the cathode terminal 3. The switch circuit of FIG. 2 is put into operation in the same manner as is described above for the circuit of FIG. 1; namely, by applying a trigger pulse from the source 8 for reducing the impedance between the anode terminal 2 and the cathode terminal 3.

The triggering of the thyristor 1 renders it conductive thereby causing ringing current to flow through the diode 20 and through the thyristor 1. This current through the thyristor 1 will now be the sum of the load current through the load resistor 6, the auxiliary current through the resistor 19, and the initial half cycle of the ringing current. During this first half cycle of the ringing current, the step recovery diode 20 will accumulate a stored charge.

The second half cycle of the ringing current provides the reverse current for turning off the thyristor 1 but, as explained above in the description of FIG. 1, the pulse across the load resistor 6 is maintained by the flow of current through the diodes 13 and 14. After both of the two outer junctions J1 and J3 have been turned off, the middle junction J2 begins to recover by recombination. Also, at this time, the load current will be applied to the step recovery diode 20 in the reverse direction for the duration of the storage time of this diode 20.

As the storage time of the diode 20 is an important factor in terminating a pulse produced by this switch circuit, it should be noted that this diode 20 is so constructed that its storage time is no shorter than and, preferably, is slightly longer than the turn-off time, or forward-blocking recovery time, of the thyristor 1. In other words, the middle junction J2 in the thyristor 1 must recover by recombination before the diode 20 recovers by it snap action. Therefore, very shortly after the middle junction J2 recovers its forward-blocking capability, the step recovery diode 20 will recover thereby producing the above-mentioned abrupt reverse step.

This steep reverse step functions to block any flow of current through the load resistor 6 that might otherwise be produced by an inherent capacity effect in the load or by residual energy stored in the turn-off circuit. Therefore, a pulse generated by this switch circuit will be terminated in a sudden fall time corresponding to the abrupt reverse step of the diode 20. Thus, the fall time of a pulse produced by the circuit of FIG. 2 will be materially shorter than the fall time of a pulse generated by the circuit of FIG. 1.

Figure 3:
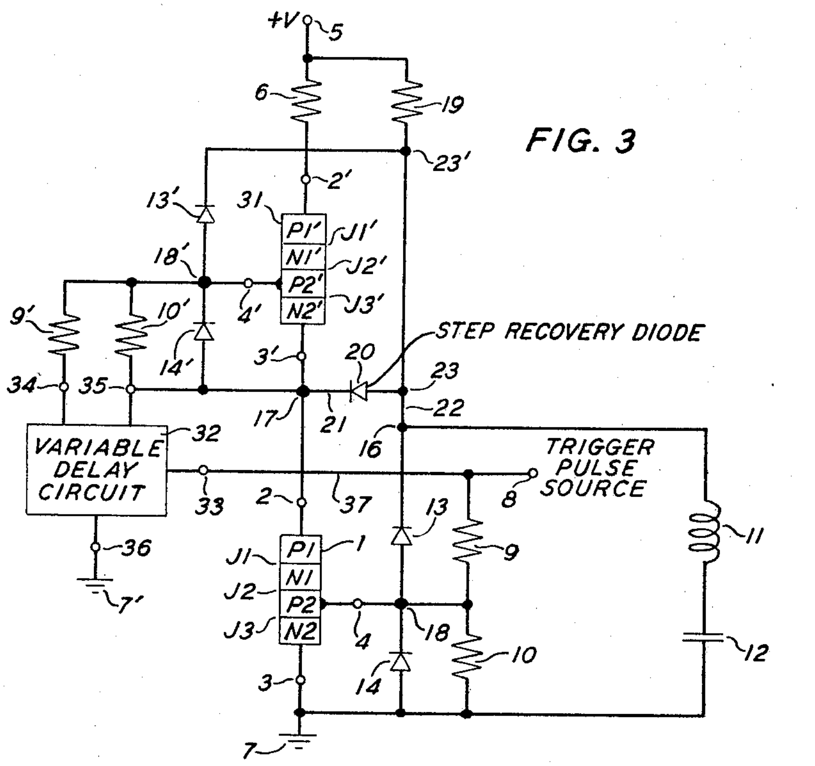
FIG. 3 shows the addition of a second thyristor to the switch circuit of FIG. 2 for variably shortening the duration of a pulse produced by this circuit.
Figure 4:
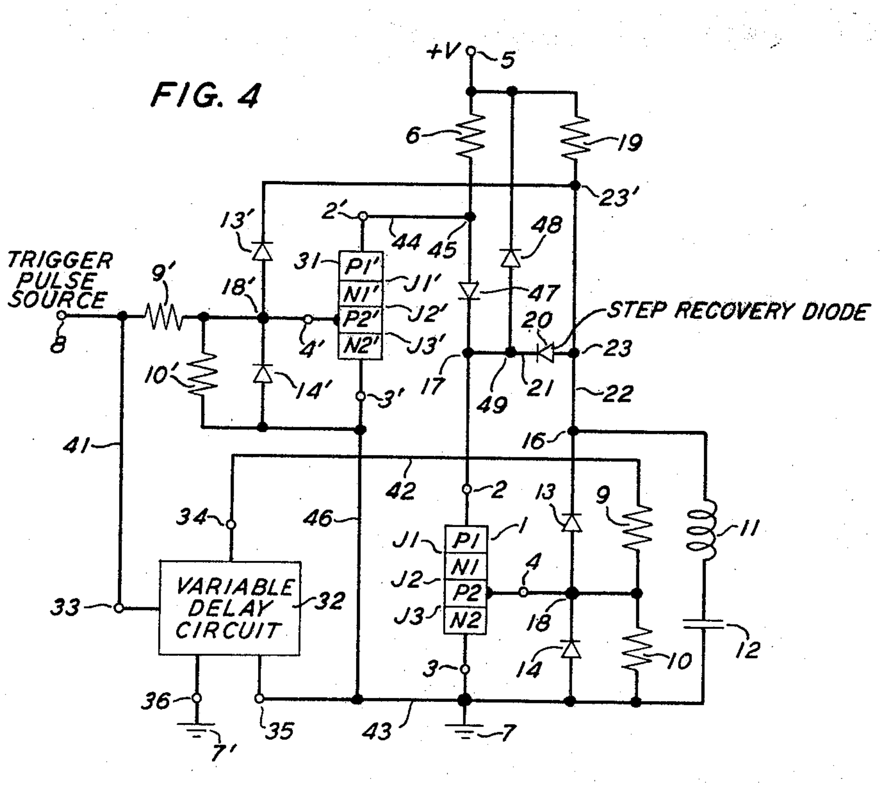
FIG. 4 illustrates the manner in which the switch circuit of FIG. 3 can be adapted for variably lengthening pulses produced thereby.

The length or duration of a pulse produced by the switch circuit of this invention can be varied by modifying the circuit of FIG. 2 to include another thyristor having at least one connection to a point between the load resistor 6 and the anode terminal 2 of the first thyristor 1. When the length of a pulse is to be shortened, the second thyristor is connected in series with the first thyristor 1 as is shown in FIG. 3; but, when the length of a pulse is to be increased, the second thyristor is connected in parallel with the first thyristor 1 as is represented in FIG. 4. Since the circuits illustrated in FIGS. 3 and 4 are modifications of the circuit of FIG. 2, the same reference designations are used in each circuit for identifying elements that are common to all of these circuits.

Accordingly, it can be seen that the pulse-shortening circuit of FIG. 3 is provided with a second thyristor 31 comprising four layers having regions P1′, N1′, P2′, and N2′ with junctions J1′, J2′, and J3′ between them. The thyristor 31 is equipped with an anode terminal 2′ connected to the upper outer layer P1′, a cathode terminal 3′ connected to the lower outer layer N2′, and a gate terminal 4′ connected to the lower intermediate layer P2′. This second thyristor 31 is inserted into the circuit of FIG. 2 by connecting its anode terminal 2′ to the lower end of the load resistor 6 and by connecting its cathode terminal 3′ to the junction 17 that exists between the cathode of the diode 20 and the anode terminal 2 of the first thyristor 1. Thus, the second thyristor 31 is connected in series with the load resistor 6 and the first thyristor 1.

Two diodes 13′ and 14′, which are similar to the diodes 13 and 14, have a point 18′ between them connected to the gate terminal 4′ of the thyristor 31. Like the diode 13, the diode 13′ has its cathode connected to the point 23 between the resistor 19 and the anode of diode 20. Similarly, the diode 14′ has its anode connected to the cathode terminal 3′ of the thyristor 31. A resistor 9′, corresponding to the resistor 9, is connected through the point 18′ to the gate terminal 4′; and a resistor 10′, similar to the resistor 10, is connected across the diode 14′.

Although the thyristor 31, like the thyristor 1, is triggered by a pulse from the source 8 of trigger pulse current, it is important to note that the application of a trigger pulse from the source 8 to the thyristor 31 is delayed by means of a variable delay circuit 32. This delay circuit 32 may be any suitable type that is commercially available and it is provided with an input terminal 33, two output terminals 34 and 35, and a ground terminal 36 leading to a source 7′ of ground potential. The input terminal 33 is connected by a lead 37 to the source 8 of trigger pulse current. One output terminal 34 is connected to the resistor 9′, and the other output terminal 35 is connected to the lower end of the resistor 10′. It should be mentioned that the delay circuit 32 includes means, such as a transformer, for isolating the output terminals 34 and 35 from the ground 7′. The delay circuit 32 further includes adjustable means, well known to those skilled in the art, for providing variable lengths of delay in the passage therethrough of a trigger pulse.

The switch circuit of FIG. 3, like the circuit of FIG. 2, is normally non-conductive. This is due to each of the thyristors 1 and 31 having a relatively high impedance between their anode terminals 2 and 2′ and their cathode terminals 3 and 3′. However, unlike the circuit of FIG. 2, current from the source 5 will not at this time be applied through the load resistor 6 to the anode terminal 2 of the thyristor 1. Instead, current from the source 5 of direct voltage will now be applied to the anode terminal 2 over a path extending through the resistor 19, diode 20, and the lead 21. This is because the path through the load resistor 6 is now blocked by the non-conductive condition of the thyristor 31.

In response to the application of a trigger pulse from the source 8, the thyristor 1 is rendered conductive in the manner described above. Ringing current from the capacitor 12 and inductor 11 will now flow along the lead 22, through the diode 20, along the lead 21 to the junction 17, and then through the thyristor 1. During this time, no pulse current is developed across the load resistor 6 due to the above-mentioned blocking action of the second thyristor 31. Thus, the circuit of FIG. 3 eliminates that which would otherwise have been the first portion of a pulse across the load resistor 6.

At the end of the delay period of the delay circuit 32, the trigger pulse is applied to the second thyristor 31 which thereupon becomes conductive. Accordingly, a path is now closed for positive current to flow from the direct voltage source 5, through the load resistor 6, through the anode-cathode paths in the thyristors 31 and 1, and then to the ground 7 which, as was stated above, is connected to the negative side of the direct voltage supply. This functions to initiate the beginning of a pulse across the load resistor 6.

As was described above, during the reverse half cycle of the ringing current, the middle junction J2 in the thyristor 1 recovers by recombination. This, in effect, opens the path from the cathode terminal 3' of the second thyristor 31 to the ground 7. It was also explained above that, very shortly after, or at the same time as, the middle junction J2 recovers its forward-blocking capability, the storage time of the step recovery diode 20 expires and it recovers by its snap action. This causes the pulse across the load resistor 6 to be terminated with a sudden fall time corresponding to the reverse step of the diode 20. Thus, the length of a pulse produced by the circuit of FIG. 3 will be shorter than the length of a pulse generated in the circuit of FIG. 2 by an amount approximately equal to the delay period of the delay circuit 32.

The amount by which a pulse is shortened in the circuit of FIG. 3 can be varied by suitably adjusting the delay period of the variable delay circuit 32. The range of this variable shortening of a pulse produced in the circuit of FIG. 3 can thus extend from zero to a point in time just before the middle junction J2 in the thyristor 1 recovers by recombination.

FIG. 4 shows a pulse-lengthening circuit which, like the circuit of FIG. 3, is provided with a variable delay circuit 32 and a second thyristor 31 having associated therewith two diodes 13' and 14' and two resistors 9' and 10'. All of these elements are similar to corresponding elements shown in FIG. 3 and, as was the case in FIG. 3, both of the thyristors 1 and 31 are normally non-conductive. Since the circuit of FIG. 4 is designed for increasing the length of a pulse generated across the load resistor 6, the gate terminal 4' of the second thyristor 31 is coupled directly through the resistor 9' to the trigger pulse source 8.

However, the application of a trigger pulse from the source 8 to the first thyristor 1 is delayed by means of the variable delay circuit 32. Thus, the trigger pulse source 8 is connected by a lead 41 to the input terminal 33 of the delay circuit 32. The delay circuit 32 has its output terminals 34 and 35 connected by leads 42 and 43, respectively, to the resistors 9 and 10 that are associated with the gate terminal 4 of the first thyristor 1.

Another distinctive feature of the circuit shown in FIG. 4 is that the second thyristor 31 is connected in parallel with the first thyristor 1. This is accomplished by connecting the anode terminal 2' of the second thyristor 31 by a lead 44 to a point 45 that is connected between the lower end of the load resistor 6 and the point 17 that is connected to the anode terminal 2 of the first thyristor 1, and also by connecting the cathode terminal 3' of the second thyristor 31 to the ground 7 in part by way of a lead 46.

Additional distinctive features in the circuit of FIG. 4 include a diode 47 connected between the points 45 and 17, and another diode 48 having its cathode connected between the upper ends of the resistor 19 and the load resistor 6 while its anode is connected to a point 49 on the lead 21 that extends between the point 17 and the cathode of the step recovery diode 20. The functions of the diodes 47 and 48 are fully explained hereinafter.

When a trigger pulse is transmitted from the source 8, the second thyristor 31 is rendered conductive thereby closing a path for positive current from the source 5 to flow through the load resistor 6, over the lead 44, through the second thyristor 31, over the lead 46 to ground 7, and then back to the negative side of the direct current source. Thus, although the delay circuit 32 prevents the trigger pulse from reaching the first thyristor 1 at this time, the formation of a pulse across the load resistor 6 will be started.

At the end of the delay period of the delay circuit 32, the trigger pulse is applied to the first thyristor 1 and causes it to become conductive. This permits ringing current from the capacitor 12 and inductor 11 to flow through the thyristor 1 to ground 7. Since the delay circuit 32 is designed to have a delay period which expires before the second thyristor 31 is turned off by the recombination of its middle junction J2, there will be no break in the pulse which is being generated across the load resistor 6.

The pulse across the load resistor 6 is finally terminated, in the manner described above, when the step recovery diode 20 recovers by its snap action very shortly after the middle junctions J2 and J2' in the thyristors 1 and 31 recover by recombination. Thus, the switch circuit of FIG. 4 will produce a pulse that is longer than a pulse generated by the circuit of FIG. 2. The additional length of the pulse will be approximately equal to the delay period of the delay circuit 32. As was explained above, this delay period can be varied by suitable adjustments of the delay circuit 32.

At this point, it should be noted that, when the second thyristor 31 was first turned on, ringing current from the capacitor 12 and inductor 11 would tend to flow from the point 16, along lead 22 to the point 23, through the step recovery diode 20, along the lead 21 to the point 17, and would then seek a path to the anode terminal 2' of the conductive thyristor 31. However, such a path is blocked by the diode 47. The reason for thus blocking the forward ringing current is that, if it were allowed to flow through the thyristor 31, then, at the start of its second half cycle, the reverse ringing current would turn off the thyristor 31. Such turning off of the thyristor 31 is undesirable because it would interfere with its pulse-lengthening function.

Although the use of the diode 47 prevents one unwanted effect, it produces a different objectionable condition. This is due to the parasitic capacity of the diode 47 which, if unchecked, would build up, or increase, the current potential in the inductor 11 to such an extent that the ringing current would become become large enough to fire the first thyristor 1 and render it conductive. To avoid such an occurrence, the increased current potential from the inductor 11 is provided with an escape path by means of the above-mentioned diode 48. Accordingly, when the current potential in the inductor 11 becomes excessive, it will flow from the point 16, along lead 22 to the point 23, through the diode 20 and along the lead 21 to the point 49, through the escape diode 48, out through the terminal 5, through the direct current supply source, and then back through ground 7 to the capacitor 12.

Thus, the escape diode 48 is designed to provide an escape path for current from the inductor 11 by clamping the voltage across the diode 47 to the voltage value at the input terminal 5.

What is claimed is:

1. A switch circuit comprising at least one thyristor having anode, cathode, and gate terminals,
   - triggering means connected to said gate terminal for triggering said thyristor,
   - turn-off means adapted for turning off said thyristor, and circuit means for connecting said turn-off means in series with said anode and cathode terminals,
   - said turn-off means including resonant means adapted for causing current to flow through said circuit means and said thyristor first in the forward direction and then in the reverse direction,
   - said switch circuit being characterized in that it further comprises control means connected into said circuit means and adapted for abruptly terminating the flow of said current in the reverse direction,
   - said control means including a diode of the step recovery type.

2. A switch circuit in accordance with claim 1 wherein said diode is provided with anode and cathode terminals, and wherein said cathode terminal of said diode is connected by said circuit means to said anode terminal of said thyristor and said anode terminal of said diode is connected by said circuit means through said resonant means to said cathode terminal of said thyristor.

3. A switch circuit in accordance with claim 2 wherein said anode terminal of said diode is also coupled to said gate terminal of said thyristor.

4. A switch circuit in accordance with claim 1 wherein said triggering means includes a source of trigger pulse current, and a variable delay circuit for coupling said source of trigger pulse current to said gate terminal.

5. A pulse switching circuit comprising at least one thyristor having anode, cathode, and gate terminals, a load circuit having a load resistor connected in series with said anode and cathode terminals, means for applying a trigger pulse to said gate terminal for turning on said thyristor whereby it begins the generation of a pulse across said load resistor, a turn-off circuit adapted for turning off said thyristor in preparation for the termination of said pulse, and means for connecting one side of said turn-off circuit to the cathode terminal of said thyristor, said switching circuit being characterized in that it further comprises means for abruptly terminating said pulse, said last-mentioned means including a step recovery diode connected in parallel with said load resistor, said diode having an anode terminal, and means for connecting an other side of said turn-off circuit to said anode terminal of said diode.

6. A pulse switching circuit in accordance with claim 5 wherein said diode includes a cathode terminal, said switching circuit further comprising means for connecting the cathode terminal of said diode to a point in said circuit between the anode terminal of said thyristor and one end of said load resistor, and means for connecting the anode terminal of said diode to the other end of said load resistor, said last-mentioned means including a second resistor.

7. A pulse switching circuit comprising at least one thyristor having four layers forming three junctions between them, an anode terminal connected to one outer layer, a cathode terminal connected to another outer layer, a gate terminal connected to an intermediate layer, a load impedance connected in series with said anode and cathode terminals, a turn-off circuit having a portion thereof connected to said gate terminal, said switching circuit being characterized in that it further includes a step recovery diode connected in parallel with said load impedance, said diode having an anode terminal, and means for connecting one side of said turn-off circuit to said cathode terminal of said thyristor and for connecting the other side of said turn-off circuit to said anode terminal of said diode.

8. A pulse switching circuit in accordance with claim 7 and further comprising a source of direct voltage, means for connecting said source to said load impedance, and means for coupling said source to said anode terminal of said diode and also to said other side of said turn-off circuit.

9. A pulse switching circuit comprising at least one thyristor having anode, cathode, and gate terminals.

a source of direct voltage, a load circuit including a load resistor connected in series with said source and said anode and cathode terminals, starting means for initiating the generation of a pulse across said load resistor, said starting means including a source of trigger pulse current, means adapted for applying a pulse of trigger current to said gate terminal for turning on said thyristor, a resonant turn-off circuit adapted for producing electric energy for turning off said thyristor in preparation for the termination of said pulse, and means for connecting one side of said turn-off circuit to the cathode terminal of said thyristor, said switching circuit being characterized in that it further comprises means for abruptly terminating said pulse, said last-mentioned means including a step recovery diode having anode and cathode terminals, circuit means for connecting said diode and its terminals, in parallel with said load resistor, and means for connecting the other side of said turn-off circuit to said anode terminal of said diode whereby the flow of said electric energy from said turn-off circuit is controlled by said step recovery diode.

10. A pulse switching circuit in accordance with claim 9 wherein said resonant turn-off circuit includes a capacitor, said switching circuit further including means adapted for applying electric charging energy to said diode and to said capacitor, said last-mentioned means comprising a resistor connected in said circuit means in series with said direct voltage source and said anode terminal of said diode, the resistance of said resistor being at least as large as the resistance of said load resistor.

11. A pulse switching circuit in accordance with claim 9 and further comprising control means for varying the width of a pulse produced by said switching circuit, said control means including a second thyristor having anode, cathode, and gate terminals, and means for connecting one of said terminals of said second thyristor to a point that is electrically coupled to said load resistor and also to said anode terminal of said first-mentioned thyristor.

12. A pulse switching circuit in accordance with claim 11 and further comprising an electrically conductive path extending from said cathode terminal of said second thyristor to said cathode terminal of said first-mentioned thyristor.

13. A pulse switching circuit in accordance with claim 11 and further including means for electrically coupling said source of trigger pulse current to said gate terminal of said second thyristor.

14. A pulse switching circuit in accordance with claim 9 and further comprising control means for shortening the length of a pulse produced by said switching circuit, said control means including a second thyristor having anode, cathode, and gate terminals, and means for connecting said second thyristor in series with said first thyristor with the anode terminal of one of said thyristors being connected to the cathode terminal of the other of said thyristors.

15. A pulse switching circuit in accordance with claim 9 and further comprising control means for shortening the length of a pulse produced by said switching circuit, said control means including a second thyristor having anode, cathode, and gate terminals, and means for effecting a series connection of said two thyristors, said last-mentioned means including means for connecting said anode terminal of said second thyristor to said load resistor, and means for connecting said cathode terminal of said second thyristor to said anode terminal of said first-mentioned thyristor.

16. A pulse switching circuit in accordance with claim 15 and further comprising a variable delay circuit having at least one input terminal and at least one output terminal, means for connecting said source of trigger pulse current to said input terminal of said delay circuit and to the gate terminal of one of said thyristors, and means for connecting said output terminal of said delay circuit to the gate terminal of the other of said thyristors.

17. A pulse switching circuit in accordance with claim 15 and further comprising means for variably delaying the application of a pulse of trigger current from said source to said gate terminal of said second thyristor, said last-mentioned means including variable delay means interconnected between said source of trigger pulse current and said gate terminal of said second thyristor.

18. A pulse switching circuit in accordance with claim 9 and further comprising control means for increasing the length of a pulse produced by said switching circuit, said control means including a second thyristor having anode, cathode, and gate terminals, and means for effecting a parallel connection of said two thyristors, said last-mentioned means including means for connecting the anode terminal of one of said thyristors to the anode terminal of the other of said thyristors.

19. A pulse switching circuit in accordance with claim 9 and further comprising control means for increasing the length of a pulse produced by said switching circuit, said control means including a second thyristor having anode, cathode, and gate terminals, and means for effecting a parallel connection of said two thyristors, said last-mentioned means including an isolation diode having an anode terminal and a cathode terminal, and means for connecting said anode terminal of said diode to said anode terminal of said second thyristor and for connecting said cathode terminal of said diode to said anode terminal of said first thyristor.

20. A pulse switching circuit in accordance with claim 19 and further including means for connecting the anode terminal of said isolation diode to one end of said load resistor and for connecting the cathode terminal of said isolation diode to the cathode terminal of said step recovery diode.

21. A pulse switching circuit in accordance with claim 20 and further comprising a clamping diode having an anode terminal and a cathode terminal, and means for connecting said cathode terminal of said clamping diode to the other end of said load resistor and for connecting said anode terminal of said clamping diode to said cathode terminal of said isolation diode and also to said cathode terminal of said step recovery diode.

22. A pulse switching system in accordance with claim 18 and further comprising means for variably delaying the application of a pulse of trigger current from said source to said gate terminal of said first thyristor, said last-mentioned means including variable delay means interconnected between said source of trigger pulse current and said gate terminal of said first thyristor.

23. A pulse switching circuit in accordance with claim 18 and further comprising a variable delay circuit having at least one input terminal and at least one output terminal, means for connecting said source of trigger pulse current to said input terminal of said delay circuit, a resistor for coupling said source of trigger pulse current to the gate terminal of one of said thyristors, and means for connecting said output terminal of said delay circuit to the gate terminal of the other of said thyristors.

References Cited

UNITED STATES PATENTS 3,359,498 12/1967 Harris ---------- 307—284 XR

DONALD D. FORRER, Primary Examiner

J. ZAZWORSKY, Assistant Examiner

U.S. Cl. X.R.

307—252, 268, 274, 284, 319